US012645151B2

(12) United States Patent
Van Goch et al.

(10) Patent No.: US 12,645,151 B2
(45) Date of Patent: Jun. 2, 2026

(54) OPERATING A METROLOGY SYSTEM, LITHOGRAPHIC APPARATUS, AND METHODS THEREOF

(71) Applicants: ASML Netherlands B.V., Veldhoven (NL); ASML Holding N.V., Veldhoven (NL)

(72) Inventors: Bram Paul Theodoor Van Goch, Maarheeze (NL); Johan Gertrudis Cornelis Kunnen, Weert (NL); Sae Na Na, Norwalk, CT (US)

(73) Assignee: ASML Netherlands B.V., Veldhoven (NL)

( * ) Notice: Subject to any disclaimer, the term of this patent is extended or adjusted under 35 U.S.C. 154(b) by 132 days.

(21) Appl. No.: 18/279,694

(22) PCT Filed: Feb. 3, 2022

(86) PCT No.: PCT/EP2022/052618
§ 371 (c)(1),
(2) Date: Aug. 31, 2023

(87) PCT Pub. No.: WO2022/184375
PCT Pub. Date: Sep. 9, 2022

(65) Prior Publication Data
US 2024/0134289 A1     Apr. 25, 2024
US 2024/0231242 A9     Jul. 11, 2024

Related U.S. Application Data

(60) Provisional application No. 63/155,592, filed on Mar. 2, 2021.

(51) Int. Cl.
*G03F 7/20*     (2006.01)
*G03F 1/84*     (2012.01)
*G03F 7/00*     (2006.01)

(52) U.S. Cl.
CPC ............ *G03F 7/70508* (2013.01); *G03F 1/84* (2013.01); *G03F 7/7065* (2013.01)

(58) Field of Classification Search
CPC ...... G03F 7/70508; G03F 1/84; G03F 7/7065; G03F 7/70491; G03F 7/70616; G03F 7/70533
See application file for complete search history.

(56) References Cited

U.S. PATENT DOCUMENTS 5,498,923  A     3/1996  La Fontaine et al.
9,274,439  B2    3/2016  Zordan
            (Continued)

FOREIGN PATENT DOCUMENTS

TW     2018-35676  A     10/2018
TW     2018-37617  A     10/2018
            (Continued)

OTHER PUBLICATIONS

International Search Report and Written Opinion of the International Searching Authority directed to International Patent Application No. PCT/EP2022/052618, mailed May 16, 2022; 11 pages.
            (Continued)

*Primary Examiner* — Mesfin T Asfaw
(74) *Attorney, Agent, or Firm* — Finnegan, Henderson Farabow, Garrett & Dunner, LLP

(57) ABSTRACT

A method includes detecting data associated with a patterning device and/or a lithographic apparatus, performing an action from a plurality of actions when a determination not to proceed is made, and performing the action on the patterning device and/or a lithographic apparatus.

15 Claims, 6 Drawing Sheets

(56)         References Cited

U.S. PATENT DOCUMENTS

| | | | |
|---|---|---|---|
| 9,348,236 | B2 | 5/2016 | Helmus et al. |
| 9,811,007 | B2 | 11/2017 | Van Boxtel et al. |
| 11,281,110 | B2 | 3/2022 | Van Dongen et al. |
| 11,347,150 | B2 | 5/2022 | Tel et al. |
| 11,461,675 | B2 | 10/2022 | Sigtermans et al. |
| 11,635,698 | B2 | 4/2023 | Tel et al. |
| 2004/0063009 | A1* | 4/2004 | Phan .................. G03F 7/70616 |
| | | | 430/311 |
| 2007/0024831 | A1* | 2/2007 | Hibbs ................. G03F 7/70783 |
| | | | 355/75 |
| 2012/0133914 | A1 | 5/2012 | Prosyentsov et al. |
| 2014/0168627 | A1 | 6/2014 | Schmitt-Weaver et al. |
| 2015/0062570 | A1 | 3/2015 | Suzuki et al. |
| 2015/0241797 | A1 | 8/2015 | Onvlee et al. |
| 2019/0102875 | A1 | 4/2019 | Chen et al. |
| 2019/0361358 | A1 | 11/2019 | Tel et al. |
| 2020/0371441 | A1 | 11/2020 | Tel et al. |

FOREIGN PATENT DOCUMENTS

| | | | |
|---|---|---|---|
| TW | 2019-37300 | A | 9/2019 |
| TW | 2019-40985 | A | 10/2019 |
| TW | 2020-01409 | A | 1/2020 |
| TW | 2020-40260 | A | 11/2020 |
| TW | 2021-07226 | A | 2/2021 |
| WO | WO 2018/072980 | A1 | 4/2018 |
| WO | WO 2020/120050 | A1 | 6/2020 |
| WO | WO 2020/156769 | A1 | 8/2020 |

OTHER PUBLICATIONS

International Preliminary Report on Patentability directed to International Patent Application No. PCT/EP2022/052618, issued Aug. 29, 2023; 8 pages.

* cited by examiner

600

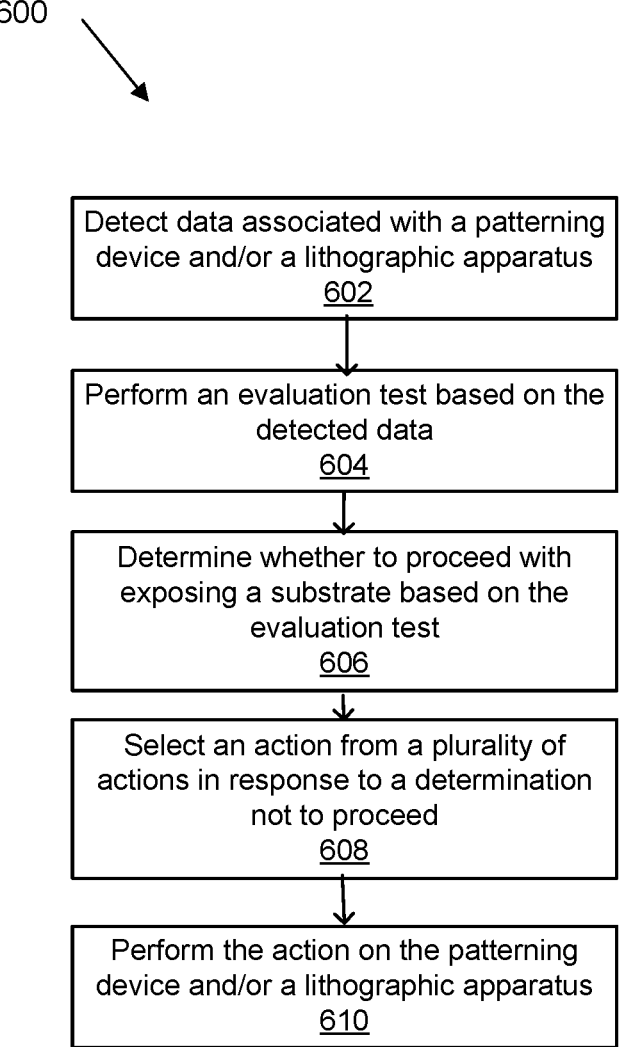

Detect data associated with a patterning
device and/or a lithographic apparatus
602

Perform an evaluation test based on the
detected data
604

Determine whether to proceed with
exposing a substrate based on the
evaluation test
606

Select an action from a plurality of
actions in response to a determination
not to proceed
608

Perform the action on the patterning
device and/or a lithographic apparatus
610

FIG. 6

OPERATING A METROLOGY SYSTEM, LITHOGRAPHIC APPARATUS, AND METHODS THEREOF

CROSS-REFERENCE TO RELATED APPLICATIONS

This application claims priority of U.S. Provisional Patent Application No. 63/155,592, which was filed on Mar. 2, 2021, and which is incorporated herein in its entirety by reference.

FIELD

The present disclosure relates to a method of operating a patterning device, for example, a reticle.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, can be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the target portions parallel or anti-parallel to this scanning direction. It is also possible to transfer the pattern from the patterning device to the substrate by imprinting the pattern onto the substrate.

During lithographic operation, different processing steps may require different layers to be sequentially formed on the substrate. Sequencing of layers is typically accomplished by exchanging different reticles, according to the desired pattern for each layer, for each pattern transfer process. A typical lithographic system works within sub-nanometer tolerances regarding patterns on the reticle and patterns transferred onto the wafer from the reticle. A contaminant particle on a reticle may introduce errors to transferred patterns. Therefore, it is desirable to maintain contaminant-free reticles capable of accurately transferring patterns onto wafers with sub-nanometer accuracy.

SUMMARY

There is a need to provide improved inspection techniques for patterning devices of a lithographic apparatus before exposing a substrate.

In some embodiments, a method includes detecting data associated with a patterning device and/or a lithographic apparatus, performing an evaluation test based on the data, determining whether to proceed with exposing a substrate based on the evaluation test, selecting using a processor an action from a plurality of actions in response to a determination not to proceed, and performing the action on the patterning device and/or the lithographic apparatus.

In some embodiments, a lithographic apparatus comprises an illumination system, a projection system, and a metrology system. The illumination system is configured to illuminate a pattern of a patterning device. The projection system is configured to project an image of the pattern onto a substrate. The metrology system comprises a processor. The processor is configured to receive data associated with the patterning device and/or the lithographic apparatus, perform an evaluation test based on the data, determine whether to proceed with exposing the substrate based on the evaluation test, select an action from a plurality of actions when a determination not to proceed is made, and send a signal to perform the action on the patterning device and/or the lithographic apparatus.

In some embodiments, a computer-readable storage medium having instructions stored thereon, execution of which by one or more processors causes the one or more processors to perform operations. The operations comprising receiving data associated with a patterning device and/or a lithographic apparatus, performing an evaluation test based on the data, determining whether to proceed with exposing a substrate based on the evaluation test, selecting an action from a plurality of actions when a determination not to proceed is made, and sending a signal to perform the action on the patterning device and/or the lithographic apparatus.

Further features of the present disclosure, as well as the structure and operation of various embodiments, are described in detail below with reference to the accompanying drawings. It is noted that the present disclosure is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present disclosure and, together with the description, further serve to explain the principles of the present disclosure and to enable a person skilled in the relevant art(s) to make and use embodiments described herein.

FIG. 6 shows method steps for performing a method including functions described herein, according to some embodiments.

Figure 1A:
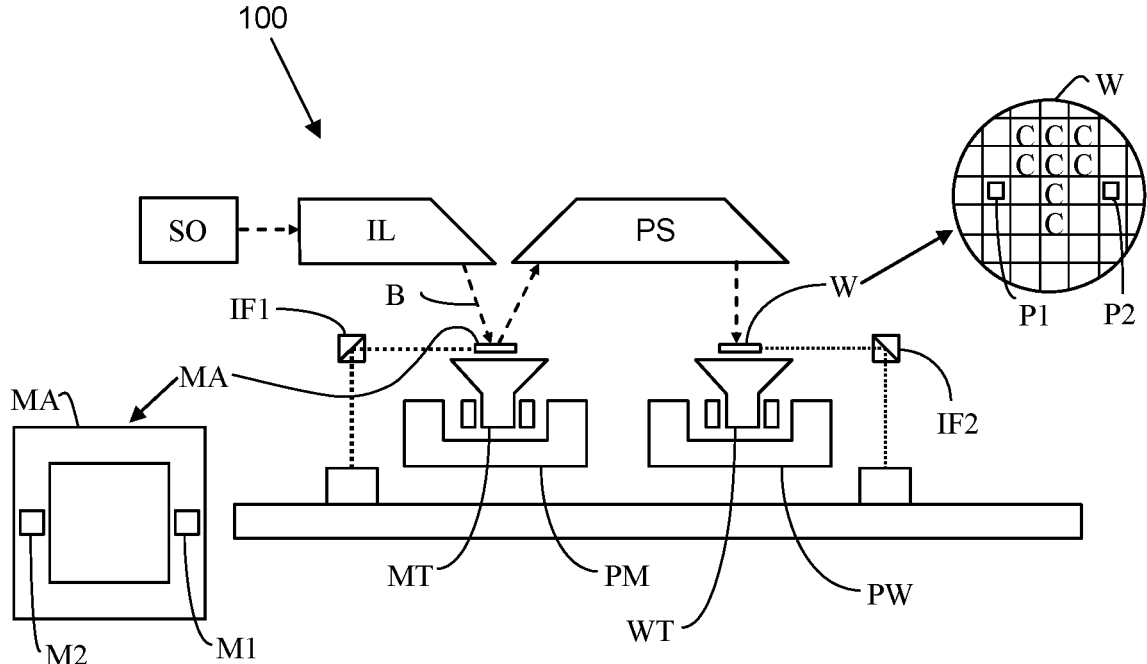
FIG. 1A shows a schematic of a reflective lithographic apparatus, according to some embodiments.

The features of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. Additionally, generally, the left-most digit(s) of a reference number identifies the drawing in which the reference number first appears. Unless otherwise indicated, the drawings provided throughout the disclosure should not be interpreted as to-scale drawings.

DETAILED DESCRIPTION

This specification discloses one or more embodiments that incorporate the features of the present disclosure. The disclosed embodiment(s) are provided as examples. The scope of the present disclosure is not limited to the disclosed embodiment(s). Claimed features are defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Spatially relative terms, such as "beneath," "below," "lower," "above," "on," "upper" and the like, can be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus can be otherwise oriented (rotated 90 degrees or at other orientations) and the spatially relative descriptors used herein may likewise be interpreted accordingly.

The term "about" as used herein indicates the value of a given quantity that can vary based on a particular technology. Based on the particular technology, the term "about" can indicate a value of a given quantity that varies within, for example, 10-30% of the value (e.g., ±10%, ±20%, or ±30% of the value).

Embodiments of the disclosure can be implemented in hardware, firmware, software, or any combination thereof. Embodiments of the disclosure may also be implemented as instructions stored on a machine-readable medium, which can be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, and/or instructions can be described herein as performing certain actions. However, it should be appreciated that such descriptions are merely for convenience and that such actions in fact result from computing devices, processors, controllers, or other devices executing the firmware, software, routines, instructions, etc. The term "non-transitory" may be used herein to characterize computer readable media used for storing data, information, instructions, and the like, with the sole exception being a transitory, propagating signal.

Before describing such embodiments in more detail, however, it is instructive to present an example environment in which embodiments of the present disclosure can be implemented.

Example Lithographic Systems

Figure 1B:
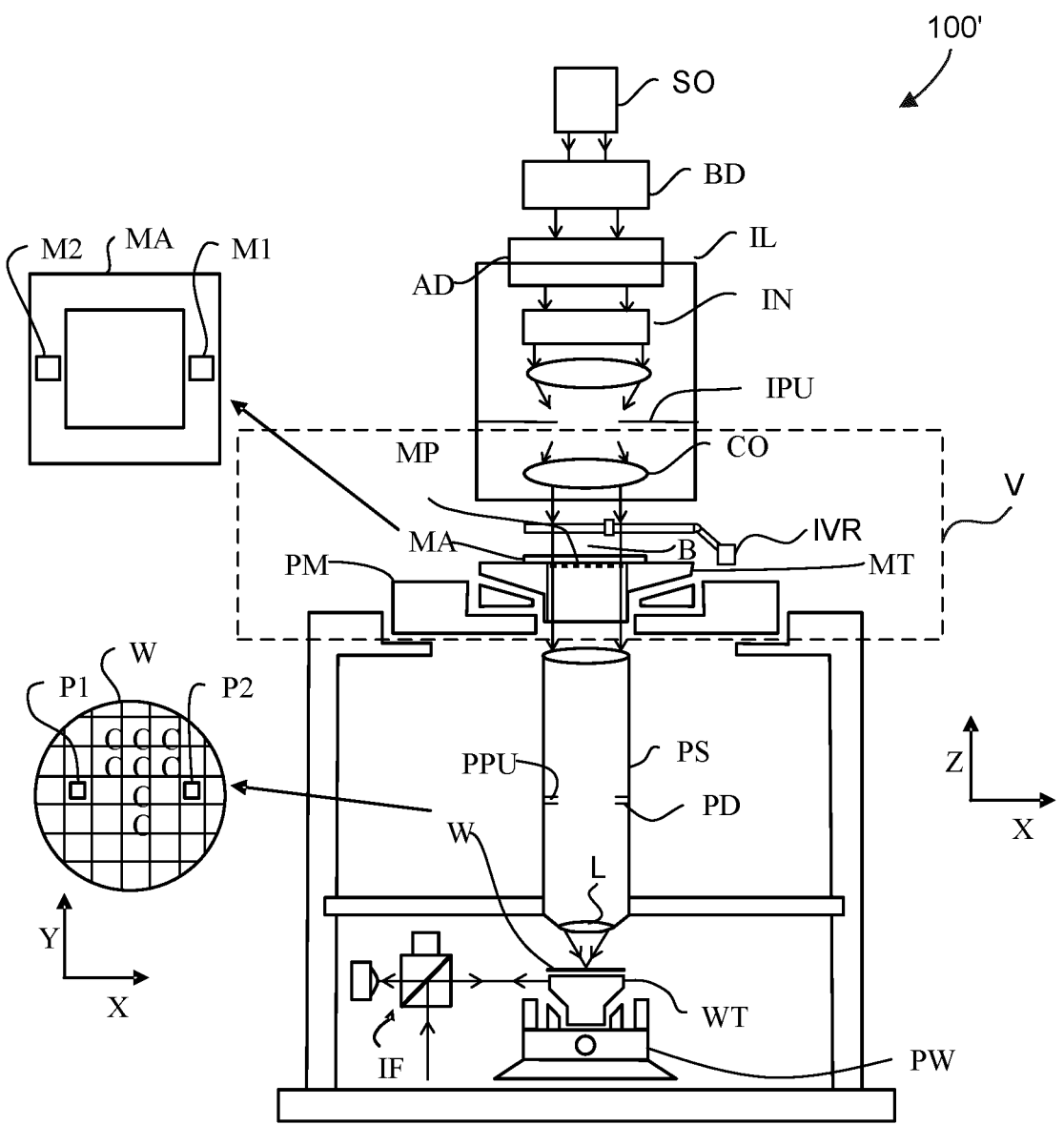
FIG. 1B shows a schematic of a transmissive lithographic apparatus, according to some embodiments.

FIGS. 1A and 1B show schematic illustrations of a lithographic apparatus 100 and lithographic apparatus 100', respectively, in which embodiments of the present disclosure may be implemented. Lithographic apparatus 100 and lithographic apparatus 100' each include the following: an illumination system (illuminator) IL configured to condition a radiation beam B (for example, deep ultra violet or extreme ultra violet radiation); a support structure (for example, a mask table) MT configured to support a patterning device (for example, a mask, a reticle, or a dynamic patterning device) MA and connected to a first positioner PM configured to accurately position the patterning device MA; and, a substrate table (for example, a wafer table) WT configured to hold a substrate (for example, a resist coated wafer) W and connected to a second positioner PW configured to accurately position the substrate W. Lithographic apparatus 100 and 100' also have a projection system PS configured to project a pattern imparted to the radiation beam B by patterning device MA onto a target portion (for example, comprising one or more dies) C of the substrate W. In lithographic apparatus 100, the patterning device MA and the projection system PS are reflective. In lithographic apparatus 100', the patterning device MA and the projection system PS are transmissive.

The illumination system IL may include various types of optical components, such as refractive, reflective, catadioptric, magnetic, electromagnetic, electrostatic, or other types of optical components, or any combination thereof, for directing, shaping, or controlling the radiation beam B.

The support structure MT holds the patterning device MA in a manner that depends on the orientation of the patterning device MA with respect to a reference frame, the design of at least one of the lithographic apparatus 100 and 100', and other conditions, such as whether or not the patterning device MA is held in a vacuum environment. The support structure MT may use mechanical, vacuum, electrostatic, or other clamping techniques to hold the patterning device MA. The support structure MT may be a frame or a table, for example, which may be fixed or movable, as required. By using sensors, the support structure MT may ensure that the patterning device MA is at a desired position, for example, with respect to the projection system PS.

The term "patterning device" MA should be broadly interpreted as referring to any device that may be used to impart a radiation beam B with a pattern in its cross-section, such as to create a pattern in the target portion C of the substrate W. The pattern imparted to the radiation beam B may correspond to a particular functional layer in a device being created in the target portion C to form an integrated circuit.

The patterning device MA may be transmissive (as in lithographic apparatus 100' of FIG. 1B) or reflective (as in lithographic apparatus 100 of FIG. 1A). Examples of patterning devices MA include reticles, masks, programmable mirror arrays, or programmable LCD panels. Masks are well known in lithography, and include mask types such as binary, alternating phase shift, or attenuated phase shift, as well as various hybrid mask types. An example of a programmable mirror array employs a matrix arrangement of small mirrors, each of which may be individually tilted so as to reflect an incoming radiation beam in different directions. The tilted mirrors impart a pattern in the radiation beam B, which is reflected by a matrix of small mirrors.

The term "projection system" PS may encompass any type of projection system, including refractive, reflective, catadioptric, magnetic, electromagnetic and electrostatic optical systems, or any combination thereof, as appropriate for the exposure radiation being used, or for other factors, such as the use of an immersion liquid on the substrate W or the use of a vacuum. A vacuum environment may be used for EUV or electron beam radiation since other gases may absorb too much radiation or electrons. A vacuum environment may therefore be provided to the whole beam path with the aid of a vacuum wall and vacuum pumps.

Lithographic apparatus 100 and/or lithographic apparatus 100' may be of a type having two (dual stage) or more substrate tables WT (and/or two or more mask tables). In such "multiple stage" machines, the additional substrate tables WT may be used in parallel, or preparatory steps may be carried out on one or more tables while one or more other substrate tables WT are being used for exposure. In some situations, the additional table may not be a substrate table WT.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIGS. 1A and 1B, the illuminator IL receives a radiation beam from a radiation source SO. The source SO and the lithographic apparatus 100, 100' may be separate physical entities, for example, when the source SO is an excimer laser. In such cases, the source SO is not considered to form part of the lithographic apparatus 100 or 100', and the radiation beam B passes from the source SO to the illuminator IL with the aid of a beam delivery system BD (in FIG. 1B) including, for example, suitable directing mirrors and/or a beam expander. In other cases, the source SO may be an integral part of the lithographic apparatus 100, 100', for example, when the source SO is a mercury lamp. The source SO and the illuminator IL, together with the beam delivery system BD, if required, may be referred to as a radiation system.

The illuminator IL may include an adjuster AD (in FIG. 1B) for adjusting the angular intensity distribution of the radiation beam. Generally, at least the outer and/or inner radial extent (commonly referred to as "σ-outer" and "σ-inner," respectively) of the intensity distribution in a pupil plane of the illuminator may be adjusted. In addition, the illuminator IL may comprise various other components (in FIG. 1B), such as an integrator IN and a condenser CO. The illuminator IL may be used to condition the radiation beam B to have a desired uniformity and intensity distribution in its cross section.

Referring to FIG. 1A, the radiation beam B is incident on the patterning device (for example, mask) MA, which is held on the support structure (for example, mask table) MT, and is patterned by the patterning device MA. In lithographic apparatus 100, the radiation beam B is reflected from the patterning device (for example, mask) MA. After being reflected from the patterning device (for example, mask) MA, the radiation beam B passes through the projection system PS, which focuses the radiation beam B onto a target portion C of the substrate W. With the aid of the second positioner PW and position sensor IF2 (for example, an interferometric device, linear encoder, or capacitive sensor), the substrate table WT may be moved accurately (for example, so as to position different target portions C in the path of the radiation beam B). Similarly, the first positioner PM and another position sensor IF1 may be used to accurately position the patterning device (for example, mask) MA with respect to the path of the radiation beam B. Patterning device (for example, mask) MA and substrate W may be aligned using mask alignment marks M1, M2 and substrate alignment marks P1, P2.

Referring to FIG. 1B, the radiation beam B is incident on the patterning device (for example, mask MA), which is held on the support structure (for example, mask table MT), and is patterned by the patterning device. Having traversed the mask MA, the radiation beam B passes through the projection system PS, which focuses the beam onto a target portion C of the substrate W. The projection system has a pupil conjugate PPU to an illumination system pupil IPU. Portions of radiation emanate from the intensity distribution at the illumination system pupil IPU and traverse a mask pattern without being affected by diffraction at the mask pattern and create an image of the intensity distribution at the illumination system pupil IPU.

The projection system PS projects an image MP' of the mask pattern MP, where image MP' is formed by diffracted beams produced from the mark pattern MP by radiation from the intensity distribution, onto a photoresist layer coated on the substrate W. For example, the mask pattern MP may include an array of lines and spaces. A diffraction of radiation at the array and different from zeroth order diffraction generates diverted diffracted beams with a change of direction in a direction perpendicular to the lines. Undiffracted beams (i.e., so-called zeroth order diffracted beams) traverse the pattern without any change in propagation direction. The zeroth order diffracted beams traverse an upper lens or upper lens group of the projection system PS, upstream of the pupil conjugate PPU of the projection system PS, to reach the pupil conjugate PPU. The portion of the intensity distribution in the plane of the pupil conjugate PPU and associated with the zeroth order diffracted beams is an image of the intensity distribution in the illumination system pupil IPU of the illumination system IL. The aperture device PD, for example, is disposed at or substantially at a plane that includes the pupil conjugate PPU of the projection system PS.

The projection system PS is arranged to capture, by means of a lens or lens group L, not only the zeroth order diffracted beams, but also first-order or first- and higher-order diffracted beams (not shown). In some embodiments, dipole illumination for imaging line patterns extending in a direction perpendicular to a line may be used to utilize the resolution enhancement effect of dipole illumination. For example, first-order diffracted beams interfere with corresponding zeroth-order diffracted beams at the level of the wafer W to create an image of the line pattern MP at highest possible resolution and process window (i.e., usable depth of focus in combination with tolerable exposure dose deviations). In some embodiments, astigmatism aberration may be reduced by providing radiation poles (not shown) in opposite quadrants of the illumination system pupil IPU. Further, in some embodiments, astigmatism aberration may be reduced by blocking the zeroth order beams in the pupil conjugate PPU of the projection system associated with radiation poles in opposite quadrants. This is described in more detail in U.S. Pat. No. 7,511,799 B2, issued Mar. 31, 2009, which is incorporated by reference herein in its entirety.

With the aid of the second positioner PW and position sensor IF (for example, an interferometric device, linear encoder, or capacitive sensor), the substrate table WT may be moved accurately (for example, so as to position different target portions C in the path of the radiation beam B). Similarly, the first positioner PM and another position sensor (not shown in FIG. 1B) may be used to accurately position the mask MA with respect to the path of the radiation beam B (for example, after mechanical retrieval from a mask library or during a scan).

In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner), the mask table MT may be connected to a short-stroke actuator only or may be fixed. Mask MA and substrate W may be aligned using mask alignment marks M1, M2, and substrate alignment marks P1, P2. Although the substrate alignment marks (as illustrated) occupy dedicated target portions, they may be located in spaces between target portions (known as scribe-lane alignment marks). Similarly, in situations in which more than one die is provided on the mask MA, the mask alignment marks may be located between the dies.

Mask table MT and patterning device MA may be in a vacuum chamber V, where an in-vacuum robot IVR may be used to move patterning devices such as a mask in and out of vacuum chamber. Alternatively, when mask table MT and patterning device MA are outside of the vacuum chamber, an out-of-vacuum robot may be used for various transportation operations, similar to the in-vacuum robot IVR. Both the in-vacuum and out-of-vacuum robots need to be calibrated for a smooth transfer of any payload (e.g., mask) to a fixed kinematic mount of a transfer station.

The lithographic apparatus 100 and 100' may be used in at least one of the following modes:

1. In step mode, the support structure (for example, mask table) MT and the substrate table WT are kept essentially stationary, while an entire pattern imparted to the radiation beam B is projected onto a target portion C at one time (i.e., a single static exposure). The substrate table WT is then shifted in the X and/or Y direction so that a different target portion C may be exposed.

2. In scan mode, the support structure (for example, mask table) MT and the substrate table WT are scanned synchronously while a pattern imparted to the radiation beam B is projected onto a target portion C (i.e., a single dynamic exposure). The velocity and direction of the substrate table WT relative to the support structure (for example, mask table) MT may be determined by the (de-)magnification and image reversal characteristics of the projection system PS.

3. In another mode, the support structure (for example, mask table) MT is kept substantially stationary holding a programmable patterning device, and the substrate table WT is moved or scanned while a pattern imparted to the radiation beam B is projected onto a target portion C. A pulsed radiation source SO may be employed and the programmable patterning device is updated as required after each movement of the substrate table WT or in between successive radiation pulses during a scan. This mode of operation may be readily applied to maskless lithography that utilizes a programmable patterning device, such as a programmable mirror array.

Combinations and/or variations on the described modes of use or entirely different modes of use may also be employed.

In some embodiments, a lithographic apparatus may generate DUV and/or EUV radiation. For example, lithographic apparatus 100' may be configured to operate using a DUV source. In another example, lithographic apparatus 100 includes an extreme ultraviolet (EUV) source, which is configured to generate a beam of EUV radiation for EUV lithography. In general, the EUV source is configured in a radiation system, and a corresponding illumination system is configured to condition the EUV radiation beam of the EUV source.

Figures 2, 3:
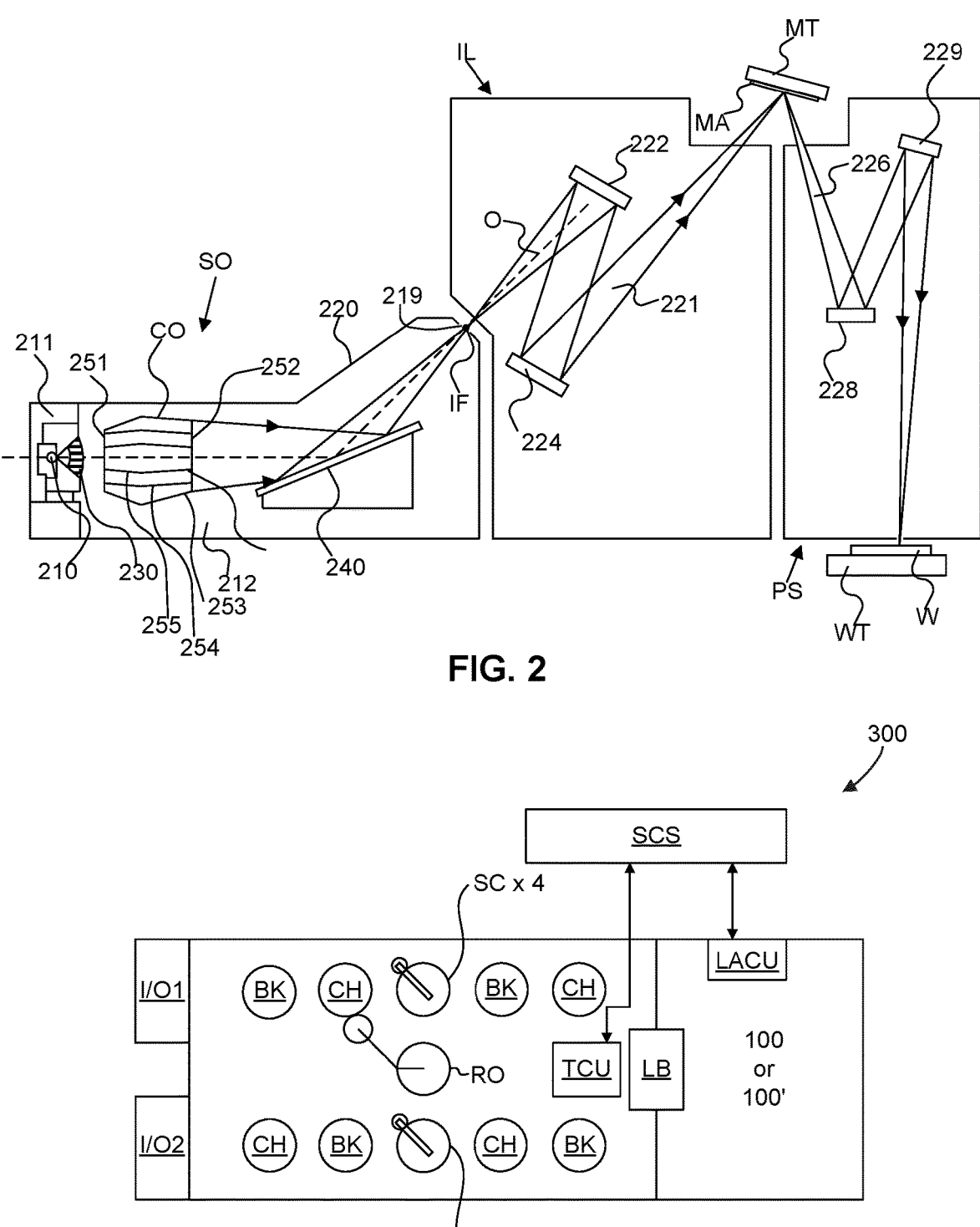
FIG. 2 shows a more detailed schematic of the reflective lithographic apparatus, according to some embodiments.
FIG. 3 shows a schematic of a lithographic cell, according to some embodiments.

FIG. 2 shows the lithographic apparatus 100 in more detail, including the source collector apparatus SO, the illumination system IL, and the projection system PS. The source collector apparatus SO is constructed and arranged such that a vacuum environment may be maintained in an enclosing structure 220 of the source collector apparatus SO. An EUV radiation emitting plasma 210 may be formed by a discharge produced plasma source. EUV radiation may be produced by a gas or vapor, for example Xe gas, Li vapor, or Sn vapor in which the very hot plasma 210 is created to emit radiation in the EUV range of the electromagnetic spectrum. The very hot plasma 210 is created by, for example, an electrical discharge causing at least a partially ionized plasma. Partial pressures of, for example, 10 Pa of Xe, Li, Sn vapor, or any other suitable gas or vapor may be required for efficient generation of the radiation. In some embodiments, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap), which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure.

The collector chamber 212 may include a radiation collector CO, which may be a so-called grazing incidence collector. Radiation collector CO has an upstream radiation collector side 251 and a downstream radiation collector side 252. Radiation that traverses collector CO may be reflected off a grating spectral filter 240 to be focused in a virtual source point IF. The virtual source point IF is commonly referred to as the intermediate focus, and the source collector apparatus is arranged such that the intermediate focus IF is located at or near an opening 219 in the enclosing structure 220. The virtual source point IF is an image of the radiation emitting plasma 210. Grating spectral filter 240 is used in particular for suppressing infra-red (IR) radiation.

Subsequently the radiation traverses the illumination system IL, which may include a faceted field mirror device 222 and a faceted pupil mirror device 224 arranged to provide a desired angular distribution of the radiation beam 221, at the patterning device MA, as well as a desired uniformity of radiation intensity at the patterning device MA. Upon reflection of the beam of radiation 221 at the patterning device MA, held by the support structure MT, a patterned beam 226 is formed and the patterned beam 226 is imaged by the projection system PS via reflective elements 228, 229 onto a substrate W held by the wafer stage or substrate table WT.

More elements than shown may generally be present in illumination optics unit IL and projection system PS. The grating spectral filter 240 may optionally be present, depending upon the type of lithographic apparatus. Further, there may be more mirrors present than those shown in the FIG. 2, for example there may be one to six additional reflective elements present in the projection system PS than shown in FIG. 2.

Collector optic CO, as illustrated in FIG. 2, is depicted as a nested collector with grazing incidence reflectors 253, 254, and 255, just as an example of a collector (or collector mirror). The grazing incidence reflectors 253, 254, and 255 are disposed axially symmetric around an optical axis O and a collector optic CO of this type is preferably used in combination with a discharge produced plasma source, often called a DPP source.

Exemplary Lithographic Cell

FIG. 3 shows a lithographic cell 300, also sometimes referred to a lithocell or cluster, according to some embodiments. Lithographic apparatus 100 or 100' may form part of lithographic cell 300. Lithographic cell 300 may also include one or more apparatuses to perform pre- and post-exposure processes on a substrate. Conventionally these include spin coaters SC to deposit resist layers, developers DE to develop exposed resist, chill plates CH, and bake plates BK. A substrate handler, or robot, RO picks up substrates from input/output ports 1/O1, 1/O2, moves them between the different process apparatuses and delivers them to the loading bay LB of the lithographic apparatus 100 or 100'. These devices, which are often collectively referred to as the track, are under the control of a track control unit TCU, which is itself controlled by a supervisory control system SCS, which also controls the lithographic apparatus via lithography control unit LACU. Thus, the different apparatuses may be operated to maximize throughput and processing efficiency.

Figures 4A, 4B:
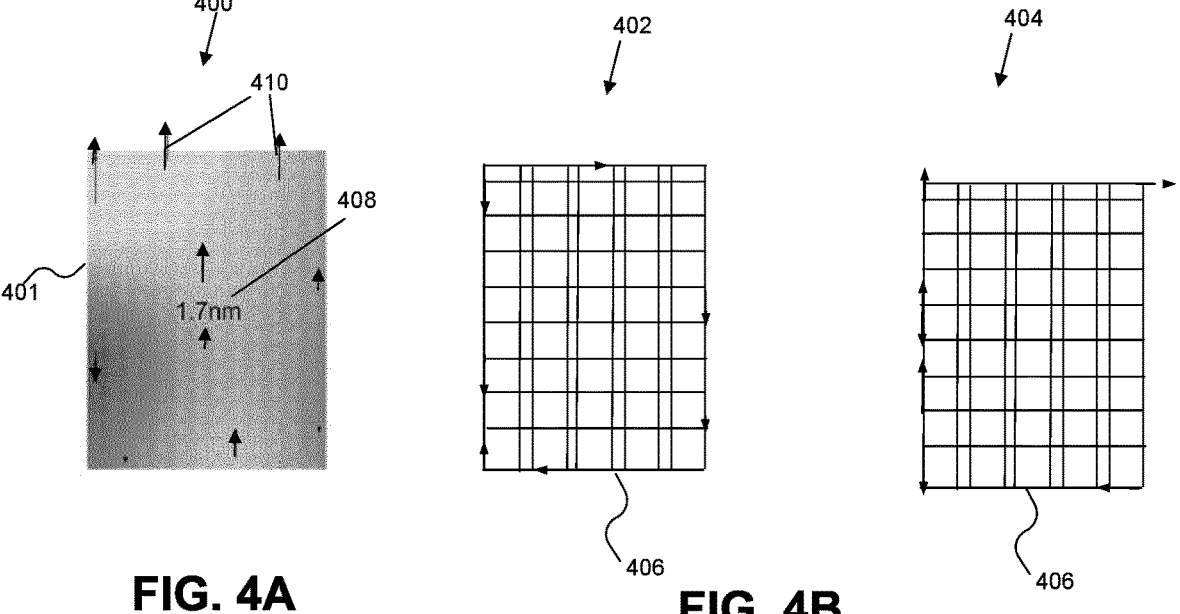
FIG. 4A is a schematic that illustrates problems caused in a portion of a resist by a defective reticle, according to some embodiments.
FIG. 4B is a schematic that illustrates measurements of a reticle performed by a transmission image sensor, according to some embodiments.

FIG. 4A illustrates problems caused in a portion of a resist 401 by a bad reticle load, according to some embodiments. The bad reticle load may be caused by a defective reticle, by a defective clamp, or the like. Schematic 400 shows the in-resist impact due to reticle stage (RS) chuck clamping distortions. A distortion 408 of 1.7 nm is shown in FIG. 4A. Error vectors are shown by arrows 410. In some aspects, a distortion such as the distortion 408 affects the yield of the lithographic apparatus (e.g., 1.7% of the layers).

In some aspects, an exposure side of a reticle can be aligned with respect to a wafer stage chuck. In some embodiments, measurements on the exposure side may be performed by a transmission image sensor (TIS) where TIS marks on the reticle are measured. Other image sensors may be employed instead of a TIS. In some embodiments, some local reticle clamping impacts may be detected. A lithographic system or apparatus may include a reticle shape correction (RSC) function to correct reticle distortions (e.g., non-flatness). However, some distortions may be not corrected by the RSC function due to frequency or localization.

FIG. 4B illustrates measurements from a TIS, according to some embodiments. Schematic 402 shows the measurements performed by the TIS for a reticle associated with the resist 401 shown in schematic 400.

In some embodiments, after the measurements are performed, a key performance indicator (KPI) can be determined based on filtered measurements from an alignment sensor. In some aspects, the KPI may be determined via offline processing or in-line processing of the measurements. The processing filters the TIS measurement to determine the KPI. In some aspects, the KPI is determined by a weighed sum of the TIS measurements. The KPI may be defined to identify an indicator of the RS chuck clamping distortion or any other reticle defect. Filtered measurements are shown in schematic 404. The errors are represented by arrows distributed across reticle 406.

In some embodiments, KPIs associated with other local reticle clamping impacts can be captured via shapes in metrology measurements, such as TIS-RSC.

In some embodiments, when the KPI is triggered (i.e., an indicator of reticle distortion is detected), exposed layers of a substrate affected by a bad reticle load (i.e., which tripped KPI) are reworked afterwards (e.g., the exposed layers are further processed). In some aspects, this increases the rework cycle time, yield, and associated costs. Further, it may be difficult to link the KPI with the badly exposed layers. In addition, the reworked layer may also have errors.

In some embodiments, a reticle load evaluation may be performed by a processor before exposing the substrates. For example, the KPI may be determined before exposing the substrate. In some aspects, the substrate can be exposed when no indicator of reticle defects is detected. In some aspects, when the KPI exceeds a threshold, then one or more actions are performed before exposing the substrate and/or repeating the reticle load evaluation. For example, a reticle reload or a reticle relaxation (e.g., gas puffing) may be performed before exposing the substrate. Thus, no rework is required and no scrap is created due to a defective reticle or bad reticle load. In some aspects, these processes can prevent yield impact and minimize the rework rates. Further, these processes can improve intermittent-type errors that may not be corrected by the lithographic system.

Figure 5:
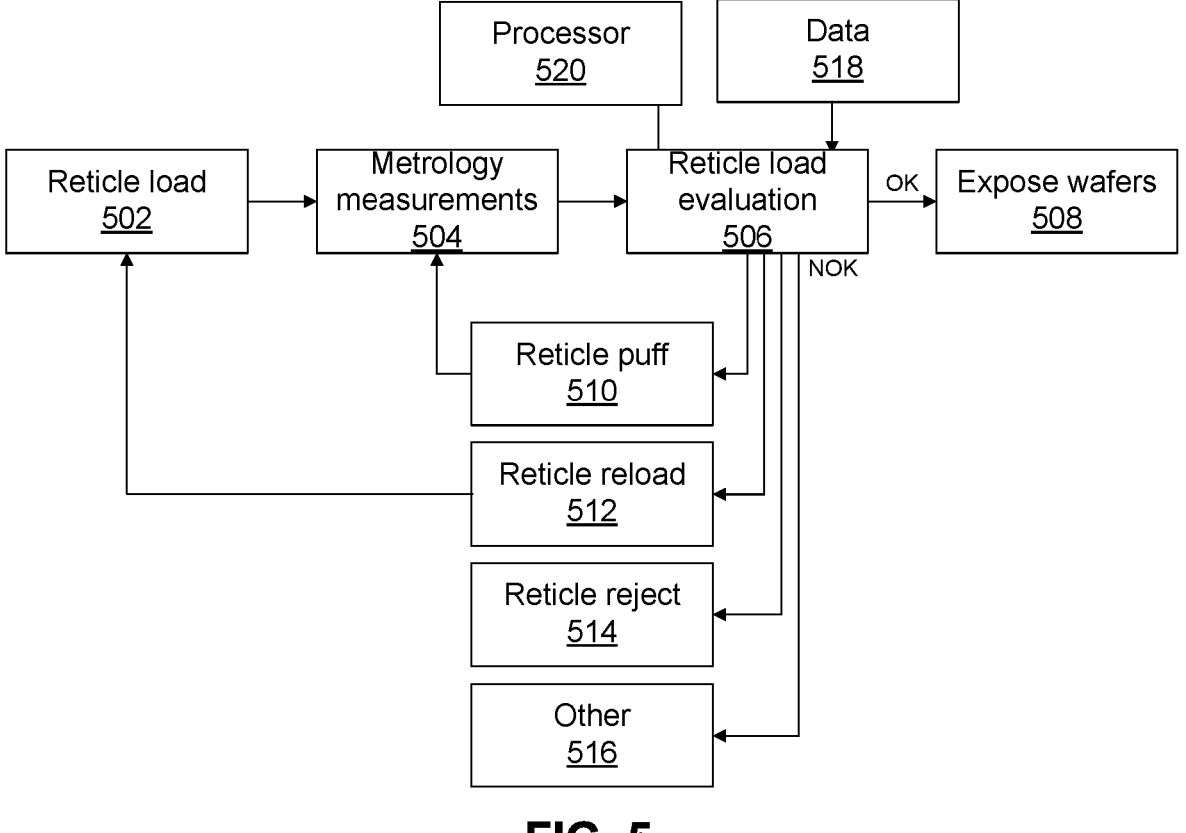
FIG. 5 is a block diagram that illustrates reticle load evaluation prior to exposure, according to some embodiments.

FIG. 5 is a block diagram that illustrates reticle load evaluation prior to exposure, according to some embodiments. In reticle load 502, a reticle (e.g., the patterning device MA) can be loaded onto support structure MT. Metrology measurements 504 can be performed to measure positions of various marks on the reticle to determine one or more KPIs. In some embodiments, measurements on the exposure side may be performed by the transmission image sensor (TIS).

A reticle load evaluation 506 is performed on the reticle by a processor 520. Processor 520 can be one or more processors, or other computing devices as described previously herein. In some embodiments, the reticle load evaluation 506 can be performed based on the metrology measurements 504. One or more key performance indicators (KPIs) may be determined. The KPI may be defined by a user. For example, the KPI may be associated with a desired overlay. Each defect indicator and/or KPI may be associated with a known defect or problem in the resist and/or reticle.

In some embodiments, when the reticle load evaluation 506 is acceptable, substrate exposure 508 occurs. In some embodiments, one or more actions may be selected from a plurality of actions based on the reticle load evaluation 506 when the reticle load evaluation 506 results in a non-acceptable result. The one or more actions may include reticle puff 510, reticle reload 512, reticle reject 514, and other actions 516. Other actions 516 can include thermal conditioning, cleaning procedures, and the like. After reticle puff 510 or other actions are completed, the metrology measurements 504 can be repeated.

In some embodiments, the reticle reload 512 is selected, and a reticle load 502 is performed. In some embodiments, a reticle reject 514 can be selected in response to a determination by the processor 520 that the reticle load evaluation 506 results in a non-acceptable result (e.g., the reticle load evaluation 506 does not meet a threshold reticle load). The reticle may be rejected when the reticle is contaminated above a threshold (e.g., highly contaminated). In some aspects, a reticle may be rejected if an indicator is detected and associated with a reticle used in one or multiple lithographic apparatuses. An indicator may be a defect associated with a patterning device and/or lithographic apparatus (e.g., reticle contamination or reticle distortion). If the same indicator is detected when using the same reticle in at least two lithographic apparatuses, the reticle can be rejected.

In some embodiments, the reticle load evaluation 506 can include determining one or more parameters and comparing the one or more parameters with a threshold. In some aspects, when a parameter meets a threshold, the reticle load evaluation 506 results in an acceptable result and the wafer is exposed 508. The reticle load evaluation 506 can include comparing one or more parameters with one or more thresholds per substrate layer. In some embodiments, selection of an action (e.g., any action of 510-516) in response to the reticle load evaluation 506 by processor 520 may be based on a desired KPI and/or a recipe.

In some embodiments, selection of an action 510-516 by the processor 520 may be based on one or more detected indicators. For example, a predefined reticle indicator such as a detected reticle profile indicating reticle contamination or distortion may be associated with an action. For example, a first indicator may be associated with a first action. The first action can include an operation to relax reticle stress (e.g., reticle puff 510). A second indicator may be associated with a second action. For example, the second action can include reticle reload 512. The associations between an indicator and an action may be based on an operation that can resolve the indicator.

In some embodiments, reticle load evaluation 506 can use data 518 acquired from the TIS and/or one or more other sensors in the lithographic apparatus and/or external sensors. In some aspects, temperatures, forces, clamp times, dynamics, defectivity measurements, and/or other data may be acquired and used. In some embodiments, the data 518 can be used to determine the one or more KPIs. In some aspects, the data 518 can be acquired from sensors associated with a reticle handler subsystem and/or a reticle stage subsystem of the lithographic apparatus.

In some aspects, a temperature associated with the reticle may be detected. For example, temperature after and/or during load may be detected. The temperature may be compared with a preset temperature threshold. In some aspects, the temperature may be compared with the temperature of a previous exposure. In response to detecting a change in the temperature (e.g., a change in temperature greater than an acceptable predetermined change in temperature) the processor 520 may select thermal conditioning from the plurality of actions 510-516. Thermal conditioning can include heating or cooling the reticle. The temperature may be acquired from a thermal sensor. The thermal sensor may monitor the temperature of a plurality of points of the reticle. An exemplary thermal sensor is described in more detail in U.S. Pat. No. 9,811,007 B2, issued Nov. 7, 2017, which is incorporated by reference herein in its entirety.

In some embodiments, forces associated with loading the reticle may be detected. For example, forces that are associated with relaxation of the reticle may be detected from a sensor and compared with a threshold force. An exemplary sensor is described in more detail in U.S. Pat. No. 9,348,236 B2, issued May 24, 2016, which is incorporated by reference herein in its entirety. One or more of the plurality of actions 510-516 may be selected by the processor 520 in response to a sensor (e.g., a force sensor) detecting a force associated with the reticle that exceeds a threshold force. An action selected by the processor 520 from the plurality of actions 510-516 may be based on a determination that a force exceeding a threshold force is detected in association with multiple reticles used within a stage. In some embodiments, an action selected by the processor 520 from the plurality of actions 510-516 may differ in response to the determination that a force exceeding a threshold force is detected in association with multiple reticles used within the stage. For example, the action selected by the processor 520 may be performed on the lithographic apparatus. In some aspects, if the forces detected are above/below a threshold, a reticle puff 510 is performed.

In some embodiments, reticle clamping times may be determined based on a detected pressure. The pressure may be measured using a sensor. An exemplary sensor is described in more detail in U.S. Pat. No. 9,274,439 B2, issued Mar. 1, 2016 which is incorporated by reference herein in its entirety. If a measured clamping time is determined to be longer than a threshold clamping time, a clamping line leak and/or obstruction may be determined. In response to a determination (e.g., by the processor 520) that a clamping time is outside of a threshold clamping time range, the processor 520 may select a reticle reload 512. In some aspects, if a defect (e.g., reticle defect and/or substrate defect) is not resolved after a reticle reload 512, the processor 520 may select a reticle reject 514.

The reticle load evaluation 506 can include comparing data 518 and metrology measurements 504 to determine whether a defect is associated with a reticle or a lithographic system. For example, a reticle defect can be determined in response to detecting the same defect associated with a reticle used with multiple lithographic systems. Data 518 can include previous evaluation test results associated with the reticle and/or the lithographic apparatus. A trend may be identified based on the previous evaluation test results and the metrology measurements 504. In some aspects, a reticle reject 514 is selected by the processor 520 when the trend indicates a defect in the reticle. In some aspects, the trend may be determined in response to detection of the same error consecutively. In some aspects, a reticle reject 514 is selected by the processor 520 when the same error is detected consecutively in the same reticle. In some aspects, an action associated with the lithographic apparatus may be selected when the same defect is detected consecutively for different reticles in the same lithographic apparatus.

FIG. 6 shows method steps (e.g., using one or more processors) for performing a method 600 including functions described herein, according to some embodiments. The method 600 of FIG. 6 can be performed in any conceivable order and it is not required that all steps be performed. Moreover, the method steps of FIG. 6 described above merely reflect an example of steps and are not limiting.

Method 600 includes detecting data associated with a patterning device and/or a lithographic apparatus, as illustrated in step 602. Detecting data associated with the patterning device and/or the lithographic apparatus can include measuring shape data, reticle load data, alignment data, pressure data, temperature data, clamp time data, dynamics data, and/or contamination data of a patterning device. Method 600 also includes performing an evaluation test (e.g., using processor 520 of FIG. 5), based on the detected data from step 602, as illustrated in step 604. In some embodiments, performing the evaluation test can include determining one or more KPIs as described with respect to FIG. 5. In some embodiments, performing the evaluation test can include comparing the detected data to one or more thresholds or threshold ranges as described with respect to FIG. 5. Method 600 also includes determining whether to proceed with exposing a substrate based on the evaluation test, as illustrated in step 606. For example, in response to a determination that the detected data associated with the patterning device is not within a threshold or threshold range as described with respect to FIG. 5, a processor may determine not to proceed with exposing a substrate.

The method 600 also includes selecting an action from a plurality of actions, such as one or more of the actions 510-516 described above, in response to a determination not to proceed, as illustrated in step 608. In some aspects, multiple actions or a sequence of actions are selected. The method 600 also includes performing the action on the patterning device and/or a lithographic apparatus, as illustrated in step 610. In some embodiments, step 602 can be performed again after completion of step 610. In other words, detection of data associated with the patterning device and/or the lithographic apparatus can be repeated after the selected action is performed.

In some embodiments, the method 600 may include determining previous evaluation test results associated with the patterning device and/or the lithography apparatus. The method 600 may include identifying a trend as discussed with respect to FIG. 5 based on the previous evaluation test results and the evaluation test. The method 600 may include selecting the action based on the trend.

The embodiments may further be described using the following clauses:

1. A method, comprising:
 detecting data associated with a patterning device and/or a lithographic apparatus;
 performing an evaluation test based on the data;
 determining whether to proceed with exposing a substrate based on the evaluation test;
 selecting, using a processor, an action from a plurality of actions in response to a determination not to proceed; and
 performing the action on the patterning device and/or the lithographic apparatus.

2. The method of clause 1, wherein detecting the data associated with the patterning device and/or the lithographic apparatus comprises detecting one or more indicators associated with a patterning device and/or a lithographic apparatus defect.

3. The method of clause 2, wherein selecting the action from the plurality of actions is based on the detected one or more indicators.

4. The method of clause 2, wherein the patterning device and/or lithographic apparatus defect is a reticle load condition.

5. The method of clause 1, wherein:
 detecting the data associated with the patterning device and/or the lithographic apparatus comprises measuring alignment data;
 performing the evaluation test comprises comparing the measured alignment data to an alignment threshold; and
 determining whether to proceed with exposing the substrate based on the evaluation test comprises determining whether the measured alignment data exceeds the alignment threshold.

6. The method of clause 1, further comprising:
 repeating the detection of data associated with the patterning device and/or the lithographic apparatus after the selected action is performed.

7. The method of clause 1, wherein the plurality of actions includes at least one of a patterning device puff, a patterning device reload, and a patterning device reject.

8. The method of clause 1, wherein performing the evaluation test based on the data comprises comparing the detected data to a threshold.

9. The method of clause 1, wherein detecting the data associated with the patterning device and/or the lithographic apparatus comprises detecting data from a sensor.

10. The method of clause 9, wherein the data detected from the sensor includes at least one of temperature data, a clamp time data, and/or pressure data associated with the patterning device.

11. The method of clause 1, further comprising:
 determining previous evaluation test results associated with the patterning device and/or the lithography apparatus;
 identifying a trend based on the previous evaluation test results and the evaluation test; and
 selecting the action based on the trend.

12. The method of clause 11, wherein the selected action is a patterning device reject when the trend is indicative of a defect in the patterning device.

13. A lithography apparatus comprising:
 an illumination system configured to illuminate a pattern of a patterning device;
 a projection system configured to project an image of the pattern onto a substrate; and
 a metrology system including
  a processor configured to:
   receive data associated with the patterning device and/or the lithographic apparatus;
   perform an evaluation test based on the data;
   determine whether to proceed with exposing the substrate based on the evaluation test;
   select an action from a plurality of actions when a determination not to proceed is made; and
   send a signal to perform the action on the patterning device and/or the lithographic apparatus.

14. The lithography apparatus of clause 13, wherein receiving data associated with the patterning device and/or the lithographic apparatus comprises detecting one or more indicators associated a patterning device and/or a lithographic apparatus defect.

15. The lithography apparatus of clause 14, wherein selecting the action from the plurality of actions is based on the detected one or more indicators.

16. The lithography apparatus of clause 14, wherein the patterning device and/or lithographic apparatus defect is a reticle load condition.

17. The lithography apparatus of clause 13, wherein the plurality of actions includes at least one of a patterning device puff, a patterning device reload, and a patterning device reject.

18. The lithography apparatus of clause 13, wherein the processor is further configured to receive data from a sensor, wherein the data received from the sensor includes at least one of temperature data, clamp time data, and/or pressure data associated with the patterning device.

19. The lithography apparatus of clause 13, wherein the processor is further configured to:

determine previous evaluation test results associated with the patterning device and/or the lithography apparatus;

identify a trend based on the previous evaluation test results and the evaluation test; and select the action based on the trend.

20. A computer-readable storage medium having instructions stored thereon, execution of which by one or more processors cause the one or more processors to perform operations, the operations comprising:

receiving data associated with a patterning device and/or a lithographic apparatus;

performing an evaluation test based on the data;

determining whether to proceed with exposing a substrate based on the evaluation test;

selecting an action from a plurality of actions when a determination not to proceed is made; and sending a signal to perform the action on the patterning device and/or a lithographic apparatus.

Although specific reference can be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, LCDs, thin-film magnetic heads, etc. The skilled artisan will appreciate that, in the context of such alternative applications, any use of the terms "wafer" or "die" herein can be considered as synonymous with the more general terms "substrate" or "target portion", respectively. The substrate referred to herein can be processed, before or after exposure, in for example a track unit (a tool that typically applies a layer of resist to a substrate and develops the exposed resist), a metrology unit and/or an inspection unit. Where applicable, the disclosure herein can be applied to such and other substrate processing tools. Further, the substrate can be processed more than once, for example in order to create a multi-layer IC, so that the term substrate used herein may also refer to a substrate that already contains multiple processed layers.

Although specific reference may have been made above to the use of embodiments of the present disclosure in the context of optical lithography, it will be appreciated that the present disclosure can be used in other applications, for example imprint lithography, and where the context allows, is not limited to optical lithography. In imprint lithography a topography in a patterning device defines the pattern created on a substrate. The topography of the patterning device can be pressed into a layer of resist supplied to the substrate whereupon the resist is cured by applying electromagnetic radiation, heat, pressure or a combination thereof. The patterning device is moved out of the resist leaving a pattern in it after the resist is cured.

It is to be understood that the phraseology or terminology herein is for the purpose of description and not of limitation, such that the terminology or phraseology of the present disclosure is to be interpreted by those skilled in relevant art(s) in light of the teachings herein.

The term "substrate" as used herein describes a material onto which material layers are added. In some embodiments, the substrate itself can be patterned and materials added on top of it may also be patterned, or may remain without patterning.

Although specific reference can be made in this text to the use of the apparatus and/or system according to the present disclosure in the manufacture of ICs, it should be explicitly understood that such an apparatus and/or system has many other possible applications. For example, it can be employed in the manufacture of integrated optical systems, guidance and detection patterns for magnetic domain memories, LCD panels, thin-film magnetic heads, etc. The skilled artisan will appreciate that, in the context of such alternative applications, any use of the terms "reticle," "wafer," or "die" in this text should be considered as being replaced by the more general terms "mask," "substrate," and "target portion," respectively.

While specific embodiments of the present disclosure have been described above, it will be appreciated that the present disclosure can be practiced otherwise than as described. The description is not intended to limit the present disclosure.

It is to be appreciated that the Detailed Description section, and not the Summary and Abstract sections, is intended to be used to interpret the claims. The Summary and Abstract sections may set forth one or more but not all exemplary embodiments of the present disclosure as contemplated by the inventor(s), and thus, are not intended to limit the present disclosure and the appended claims in any way.

The present disclosure has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein.

The breadth and scope of protected subject matter should not be limited by any of the above-described exemplary embodiments, but should be defined only in accordance with the following claims and their equivalents.

The invention claimed is:

1. A method, comprising:

detecting data associated with a patterning device and/or a lithographic apparatus comprising detecting one or more indicators associated with a patterning device defect, the patterning device defect comprising a patterning device load condition associated with a defective patterning device clamp;

performing an evaluation test based on the data;

determining whether to proceed with exposing a substrate based on the evaluation test;

selecting, using a processor, an action from a plurality of actions based on the one or more indicators in response to a determination not to proceed, the plurality of actions comprising at least one of a patterning device puff and a patterning device reload onto a support structure; and performing the action on the patterning device and/or the lithographic apparatus.

2. The method of claim 1, wherein detecting the data associated with the patterning device and/or the lithographic apparatus comprises detecting one or more indicators associated with a patterning device and/or a lithographic apparatus defect.

3. The method of claim 2, wherein:

selecting the action from the plurality of actions is based on the detected one or more indicators; and/or the patterning device and/or lithographic apparatus defect is a reticle load condition.

4. The method of claim 1, wherein:

detecting the data associated with the patterning device and/or the lithographic apparatus comprises measuring alignment data;

performing the evaluation test comprises comparing the measured alignment data to an alignment threshold; and determining whether to proceed with exposing the substrate based on the evaluation test comprises determining whether the measured alignment data exceeds the alignment threshold.

5. The method of claim 1, further comprising:

repeating the detection of data associated with the patterning device and/or the lithographic apparatus after the selected action is performed.

6. The method of claim 1, wherein the plurality of actions includes at least one of a patterning device puff, a patterning device reload onto the support sturcture, and a patterning device reject.

7. The method of claim 1, wherein:

performing the evaluation test based on the data comprises comparing the detected data to a threshold;

detecting the data associated with the patterning device and/or the lithographic apparatus comprises detecting data from a sensor; and the data detected from the sensor includes at least one of temperature data, a clamp time data, and/or pressure data associated with the patterning device.

8. The method of claim 1, further comprising:

determining previous evaluation test results associated with the patterning device and/or the lithography apparatus;

identifying a trend based on the previous evaluation test results and the evaluation test; and selecting the action based on the trend, wherein the selected action is a patterning device reject when the trend is indicative of a defect in the patterning device.

9. A lithography apparatus comprising:

an illumination system configured to illuminate a pattern of a patterning device;

a projection system configured to project an image of the pattern onto a substrate; and a metrology system comprising a processor, the processor being configured to:

receive data associated with the patterning device and/or the lithographic apparatus, wherein the data associated with the patterning device and/or the lithographic apparatus comprises one or more indicators associated with a patterning device defect, and the patterning device defect comprises a patterning device load condition associated with a defective patterning device clamp;

perform an evaluation test based on the data;

determine whether to proceed with exposing the substrate based on the evaluation test;

select an action from a plurality of actions based on the one or more indicators when a determination not to proceed is made, wherein the plurality of actions comprises at least one of a patterning device puff and a patterning device reload onto a support structure; and send a signal to perform the action on the patterning device and/or the lithographic apparatus.

10. The lithography apparatus of claim 9, wherein receiving data associated with the patterning device and/or the lithographic apparatus comprises detecting one or more indicators associated a patterning device and/or a lithographic apparatus defect.

11. The lithography apparatus of claim 10, wherein:

selecting the action from the plurality of actions is based on the detected one or more indicators; and/or the patterning device and/or lithographic apparatus defect is a reticle load condition.

12. The lithography apparatus of claim 9, wherein the plurality of actions includes at least one of a patterning device puff, a patterning device reload onto the support structure, and a patterning device reject.

13. The lithography apparatus of claim 9, wherein the processor is further configured to receive data from a sensor, wherein the data received from the sensor includes at least one of temperature data, clamp time data, and/or pressure data associated with the patterning device.

14. The lithography apparatus of claim 9, wherein the processor is further configured to:

determine previous evaluation test results associated with the patterning device and/or the lithography apparatus;

identify a trend based on the previous evaluation test results and the evaluation test; and select the action based on the trend.

15. A computer-readable storage medium having instructions stored thereon, execution of which by one or more processors cause the one or more processors to perform operations, the operations comprising:

receiving data associated with a patterning device and/or a lithographic apparatus, the data associated with the patterning device and/or the lithographic apparatus comprising one or more indicators associated with a patterning device defect, and the patterning device defect comprises a patterning device load condition associated with a defective patterning device clamp;

performing an evaluation test based on the data;

determining whether to proceed with exposing a substrate based on the evaluation test;

selecting an action from a plurality of actions based on the one or more indicators when a determination not to proceed is made, the plurality of actions comprising at least one of a patterning device puff and a patterning device reload onto a support structure; and sending a signal to perform the action on the patterning device and/or a lithographic apparatus.

* * * * *